United States Patent [19]
Nakagawa et al.

[11] Patent Number: 6,064,592
[45] Date of Patent: May 16, 2000

[54] NON-VOLATILE SEMICONDUCTOR MEMORY FEATURING EFFECTIVE CELL AREA REDUCTION USING CONTACTLESS TECHNOLOGY

[75] Inventors: Kenichiro Nakagawa; Hiroshi Sugawara, both of Tokyo, Japan

[73] Assignee: NEC Corporation, Tokyo, Japan

[21] Appl. No.: 09/270,321

[22] Filed: Mar. 16, 1999

[30] Foreign Application Priority Data

Mar. 16, 1998 [JP] Japan .................................. 10-064926

[51] Int. Cl.[7] .................................................. G11C 16/00
[52] U.S. Cl. ................ 365/185.05; 365/63; 365/185.11; 365/185.13
[58] Field of Search .......................... 365/185.05, 185.11, 365/185.13, 51, 63

[56] References Cited

U.S. PATENT DOCUMENTS

| | | |
|---|---|---|
| 5,526,307 | 6/1996 | Yiu et al. ............................ 365/185.01 |
| 5,583,808 | 12/1996 | Brahmbhatt ......................... 365/185.05 |
| 5,691,938 | 11/1997 | Yiu et al. ............................ 365/185.11 |
| 5,777,922 | 7/1998 | Choi et al. ........................... 365/185.05 |
| 5,825,688 | 10/1998 | Ueki ................................... 365/185.11 |
| 5,969,977 | 10/1999 | Camerlenghi et al. ............. 365/185.11 |

FOREIGN PATENT DOCUMENTS 6-283721 10/1994 Japan .

*Primary Examiner*—Tan T. Nguyen
*Attorney, Agent, or Firm*—Scully, Scott Murphy & Presser

[57] ABSTRACT

In order to achieve effective reduction of memory cell area in a contactless type non-volatile memory, the main bit lines ran zigzag in the column direction connecting the buried local bit lines in two adjacent columns of memory cell blocks alternately. This permits the number of main bit lines to be half, thereby reducing the pitch of the main bit lines with the result of reducing the memory cell area.

9 Claims, 16 Drawing Sheets ered. As shown in FIG. 1, the flash memory cell block, denoted by numeral 10, comprises two identical memory sections 12A and 12B that are arranged in a mirror image relationship with respect to a phantom line 14. Thus, only the memory section 12B will be described for the sake of simplifying the disclosure. The memory section 12B comprises a plurality of pairs of floating gate transistors 16aa–16ab, 16ba–16bb, . . . , 16na–16nb each provided in the row direction.

NON-VOLATILE SEMICONDUCTOR MEMORY FEATURING EFFECTIVE CELL AREA REDUCTION USING CONTACTLESS TECHNOLOGY

BACKGROUND OF THE INVENTION

1. Field of the Invention

The present invention relates generally to achieving higher density of non-volatile memories, and more specifically to techniques for effectively reducing cell areas of non-volatile memories, such as flash memories, using a so-called "contactless" approach.

2. Description of the Related Art

Non-volatile memories use a variety of memory cell designs. One type of non-volatile memory cells uses an electrically isolated floating gate to trap charge, and this type of memory cell is referred to as a flash memory. Flash memory is a new variation of a programmable non-volatile memory, which is gaining favor because they can be erased and programmed (or reprogrammed) faster than the existing EPROMs (erasable programmable read-only memories), and because they use a simpler storage cell, thereby allowing more memory cells on a single chip.

Prior to turning to the present invention, it is deemed preferable to describe, with reference to FIGS. 1 to 4, a conventional flash memory that may be relevant to the present invention.

FIG. 1 is a circuit diagram schematically showing part of a flash memory cell block before metal lines for interconnecting memory cell blocks are not yet provided. As shown in FIG. 1, the flash memory cell block, denoted by numeral 10, comprises two identical memory sections 12A and 12B that are arranged in a mirror image relationship with respect to a phantom line 14. Thus, only the memory section 12B will be described for the sake of simplifying the disclosure. The memory section 12B comprises a plurality of pairs of floating gate transistors 16aa–16ab, 16ba–16bb, . . . , 16na–16nb each provided in the row direction.

Each pair of the floating gate transistors 16 is formed so as to assume a drain-source-drain configuration in this particular case, wherein a single source diffusion is shared by two columns of floating gate transistors. Five elongated buried diffusion regions 18a–18e are formed on a semiconductor substrate (not shown) in parallel in the column direction. More specifically, each of the diffused regions 18a and 18e is used to form drain regions as well as local bit lines, while each of the diffused regions 18b and 18d is used to form a channel between drain and source of each floating gate transistor. On the other hand, the elongated diffusion region 18c is utilized to form the source areas of the memory cells and also a source connecting line. The elongated diffusion regions 18a–18e are buried one over which metal lines are provided as mentioned later.

Further, a plurality of word lines Wa–Wn are formed in a manner that is normal to each of the elongated diffusion regions 18a–18e (viz., in the row direction), and are coupled to the gate electrodes of the corresponding memory cell transistors 16aa, 16ab, . . . , 16nb. Still further, column select transistors 20a and 20b are provided whose on/off operations are controlled by a column select signal appearing on a column select line 22. Two bit line contacts 24a and 24b are respectively provided for coupling the bit lines 18a and 18e to corresponding main (or global) bit lines as discussed later. Some components in the other (viz., upper) section 12A are denoted by the same reference numerals (notations) used with the corresponding ones in the lower section 12A plus a prime.

FIG. 2 is a diagram schematically showing layout of a plurality of memory cell blocks in the vicinity of the bit line contacts 24a and 24b. The arrangement shown in FIG. 2 is readily understood when referring back to the circuitry of FIG. 1 and thus, further descriptions of the layout of FIG. 2 will not be given for brevity.

FIG. 3 is a circuit diagram showing two main bit lines 30a and 30b and a main source line 32, which are added to the circuit shown in FIG. 1. Although it is not clear from FIG. 3, the main bit lines 30a and 30b are provided over the buried diffusion regions 18a and 18e by way of a suitable insulation layer (not shown). The main bit lines 30a and 30b are respectively coupled to the local (viz., buried) bit lines 18a and 18b via the column select transistors 20a and 20b. On the other hand, the main source line 32 is also provided over the buried local source line 18c.

FIG. 4 is a diagram schematically showing layout of a plurality of memory cell blocks whose circuitry has been shown in FIG. 3. It is understood that the main bit lines 30a and 30b and the main source line 32 are respectively provided onto the buried diffusion regions 18a, 18c, and 18e by way of a suitable insulator (not shown).

A so-called "contactless" array is the array of memory cells which are interconnected via buried diffusion in the column direction, and the array has one contact every predetermined number of rows. Thus, elimination of contacts between the buried and main bit lines results in a cell area shrink. The above-mentioned drain-source-drain configuration of the contactless EPROM cell is disclosed by U.S. Pat. No. 5,526,307 to Yiu et al., U.S. Pat. No. 5,691,938 to Yiu et al., or Japanese Laid-open Patent Application No. 6-283721.

As is known in the art, there are typically two ways for programming and erase operations. That is, one way is to use channel hot electron injection for programming and Fowler-Nordheim tunneling for erase, while the other way utilizes Fowler-Nordheim tunneling for both programming and erase. In either case, electrons are extracted by applying a voltage to the source or drain. Thus, in order not to disturb the memory cells with which no programming or erase is implemented, the column transistors 20a, 20b, 20b' are provided in close proximity of the bit line contacts 24a and 24b.

As best shown in FIG. 4, the conventional memory cell array is configured such that the main bit lines 30a and 30b and the main source line 32 are respectively formed on the buried local bit lines 18a and 18e and the buried local source line 18c. This means that it is not possible to narrow the pitch of the memory cell in the direction of word line (viz., in the row direction) in excess of the pitch of the main bit/source lines (viz., metal lines) 30a, 30b, and 32. In other words, in order to scale down the memory cell, it is necessary to narrow the pitch of the metal lines.

SUMMARY OF THE INVENTION

It is therefore an object of the present to provide a contactless non-volatile memory which features effective cell area reduction.

In brief, the object is achieved by the improved techniques wherein, in order to achieve effective reduction of memory cell area in a contactless type non-volatile memory, the main bit lines ran zigzag in the column direction connecting the buried local bit lines in two adjacent columns of memory cell blocks alternately. This permits the number of main bit lines to be half, thereby reducing the pitch of the main bit lines with the result of reducing the memory cells area.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 1:
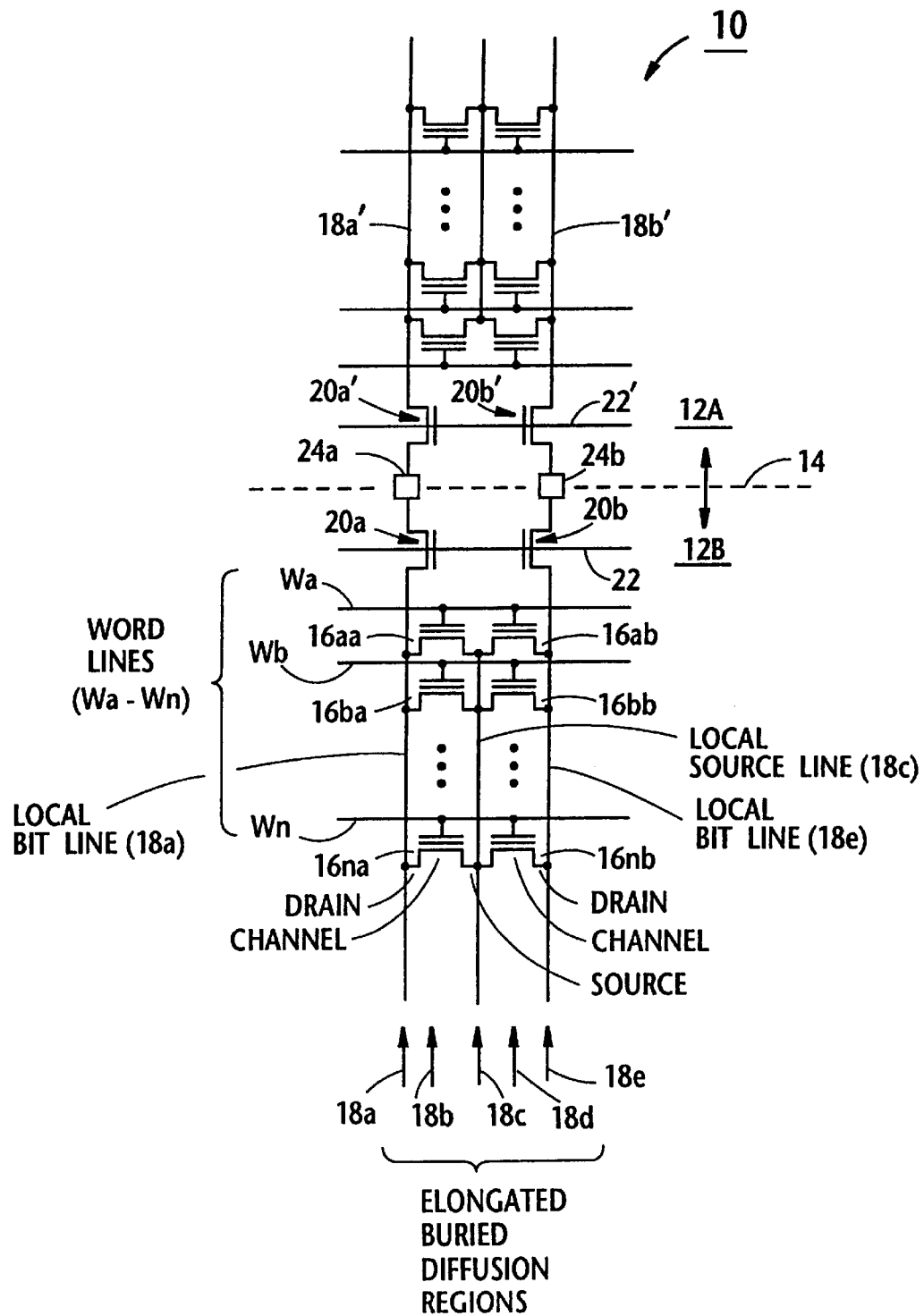
FIG. 1 is a schematic circuit diagram showing part of a conventional memory cell block.
Figure 2:
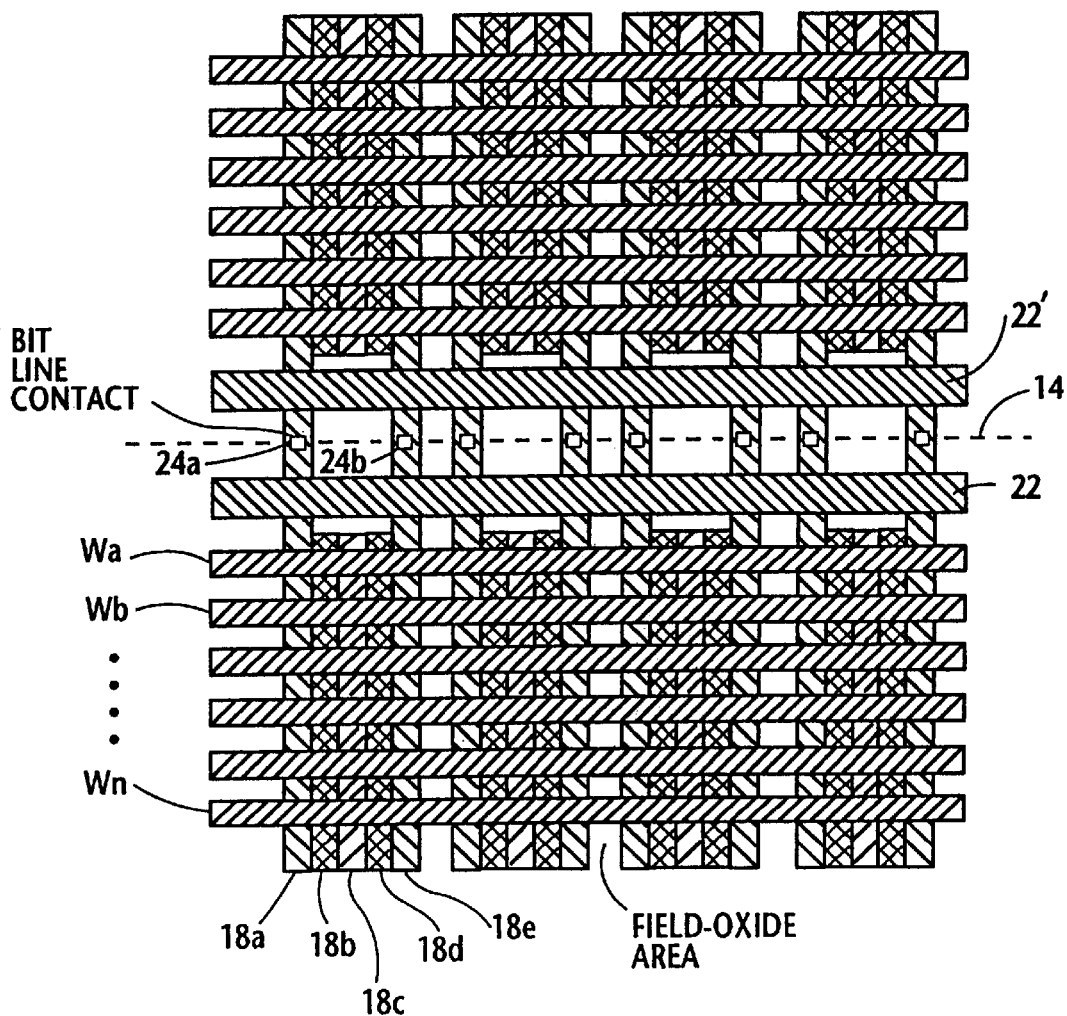
FIG. 2 is a schematic diagram showing layout of the memory cell blocks in the vicinity of bit line contacts, each memory cell block corresponding to the block shown in FIG. 1.
Figure 3:
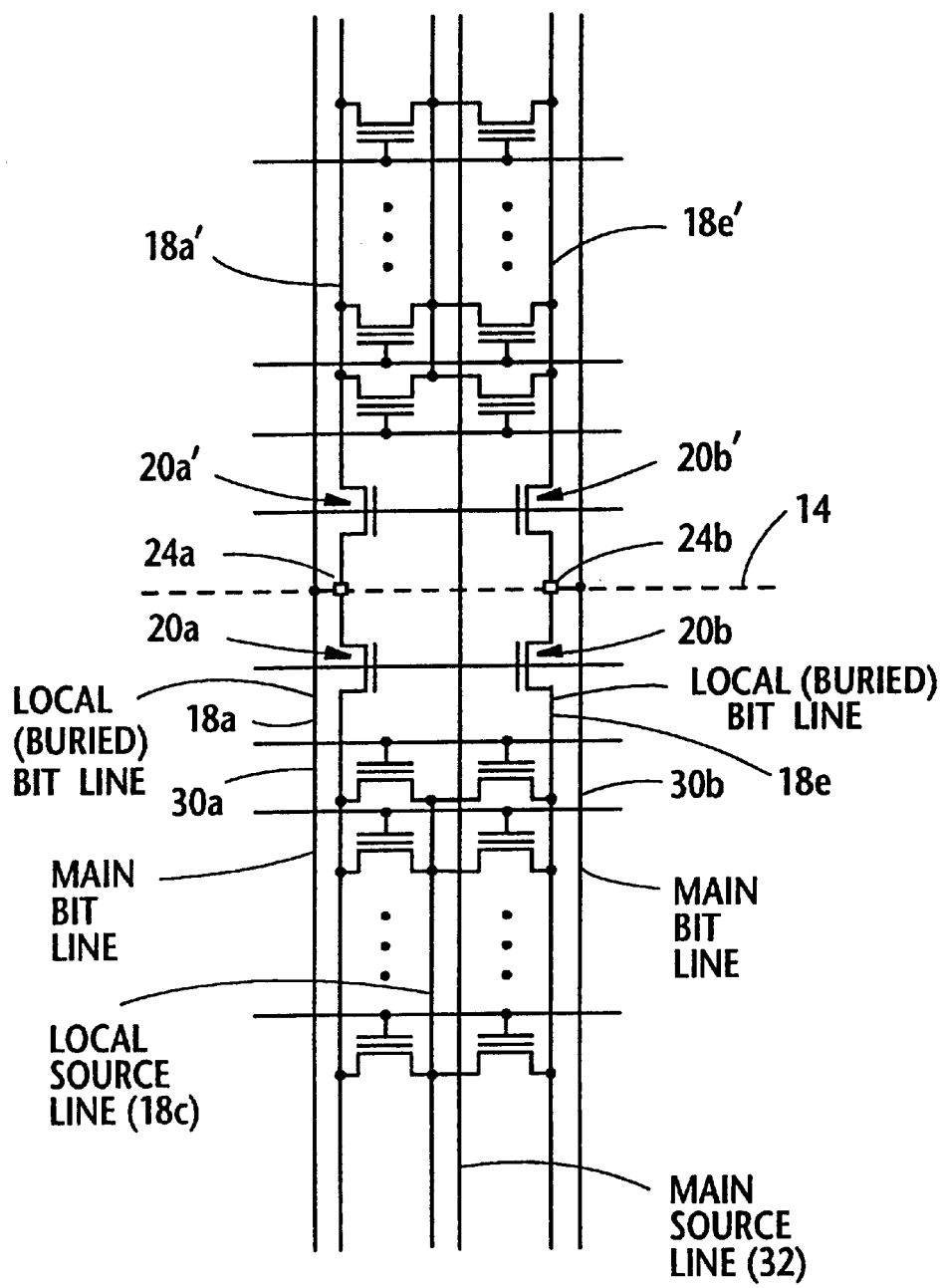
FIG. 3 is a circuit diagram schematically showing two main bit lines and one main source line that are added to the circuit of FIG. 1.
Figure 4:
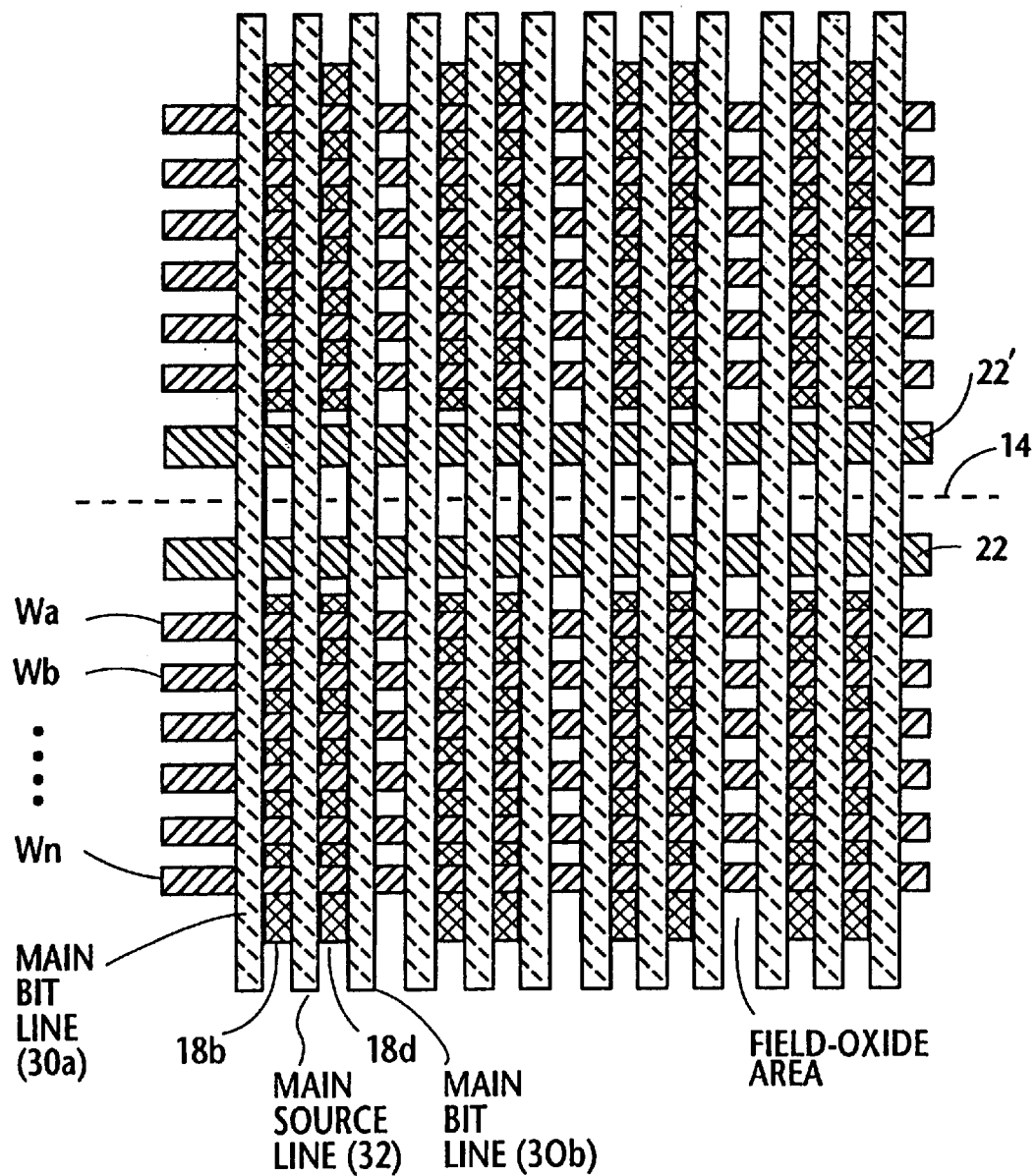
FIG. 4 is a schematic diagram showing layout of the memory cell blocks, each circuit of which has been shown in FIG. 3.

A first embodiment of the present invention will be described with reference to FIGS. 5–10 and 11A–11F. In order to simplify the description, the elements or portions already referred to in connection with FIGS. 1–4 will be denoted by like reference numerals (notations) in the remaining drawings.

Figure 5:
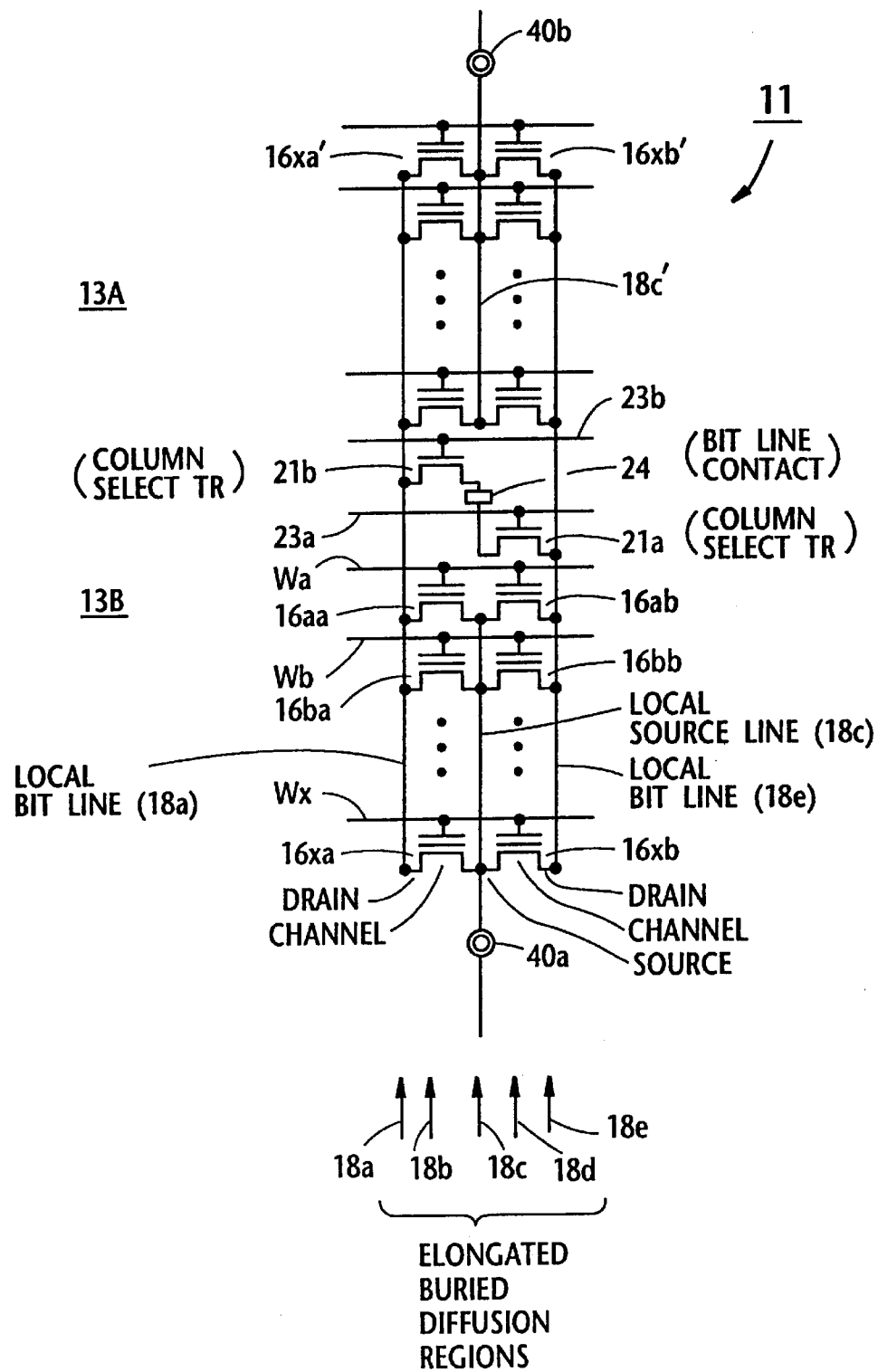
FIG. 5 is a circuit diagram schematically showing a memory cell block according to a first embodiment of the present invention.

As shown in FIG. 5, a flash memory cell block, generally indicated by numeral 11, comprises two memory sections 13A and 13B that are arranged in a symmetrical manner with respect to a bit line contact (metal-to-diffusion contact) 24. Thus, as in the opening paragraphs, the description will focus on the memory section 13B for the sake of brevity. The memory section 13B comprises a plurality of pairs of floating gate transistors 16aa–16ab, 16ba–16bb, . . . , 16xa–16xb each provided in the row direction.

Each pair of the floating gate transistors 16 is formed so as to assume a drain-source-drain configuration as in the above-mentioned conventional case. Five elongated "buried" diffusion regions 18a–18e are formed on a semiconductor substrate (not shown) in parallel in the column direction. These diffusion (diffused) regions 18a–18e have been described with reference to FIG. 1 and thus, the descriptions thereof will not be iterated for simplification of the disclosure.

Further, as in the conventional case, a plurality of word lines Wa–Wn are formed in a manner that is normal to each of the elongated diffusion regions 18a–18e (viz., in the row direction), and are coupled to the gate electrodes of the corresponding memory cell transistors 16aa, 16ab, . . . , 16xb. Still further, two column select transistors 21a and 21b are provided whose on/off operations are controlled by column select signals appearing on column select lines 23a and 23b. Two source line contacts 40a and 40b are provided at the opposite ends of the memory cell block 11. Some components in the upper section 13A are denoted by the same reference numerals (notations) as used with the counterparts in the lower section 12A plus a prime.

Figure 6:
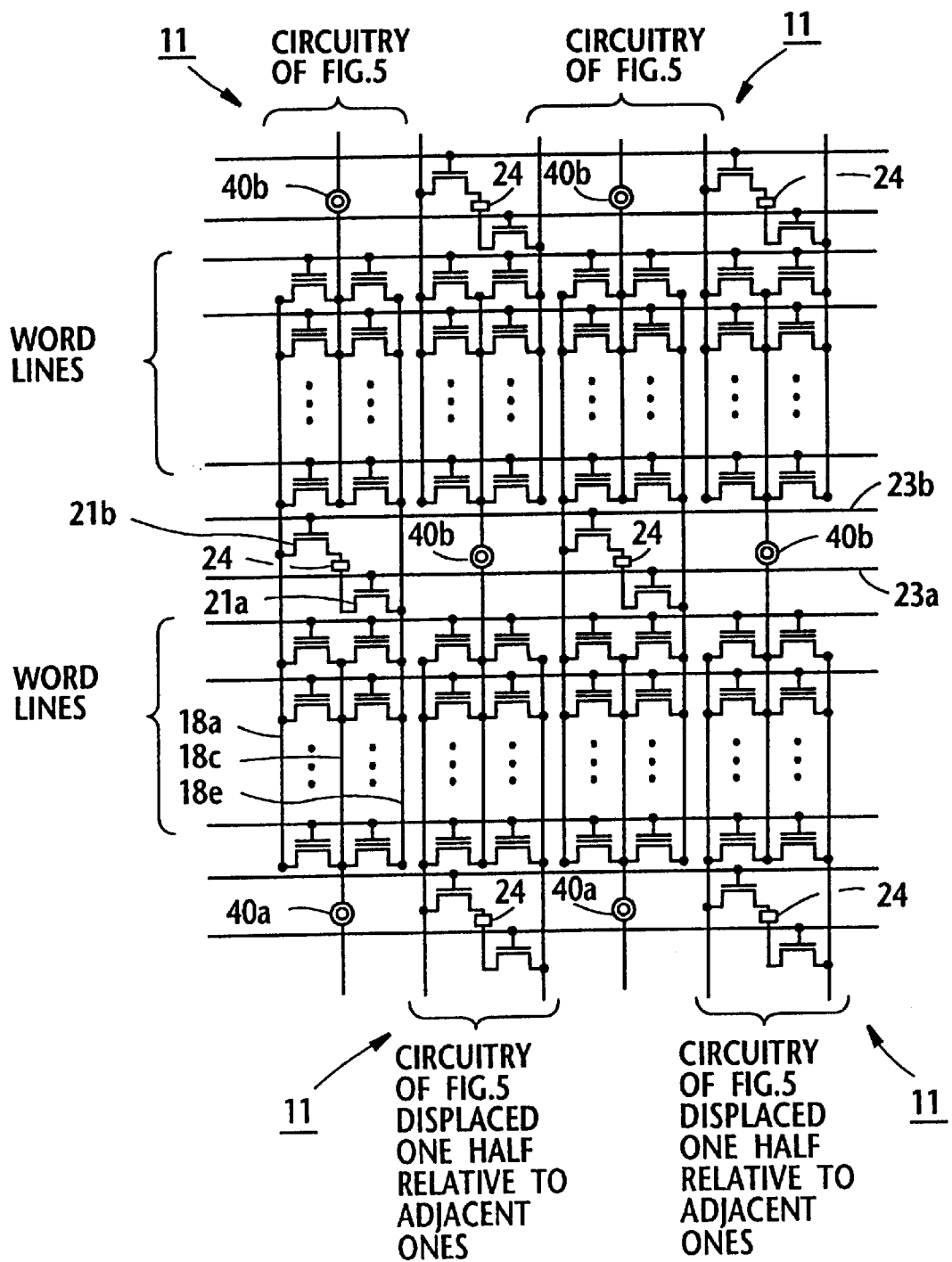
FIG. 6 is a circuit diagram schematically showing a plurality of memory cell blocks arranged in the row direction, each block being illustrated in FIG. 5.
Figure 7:
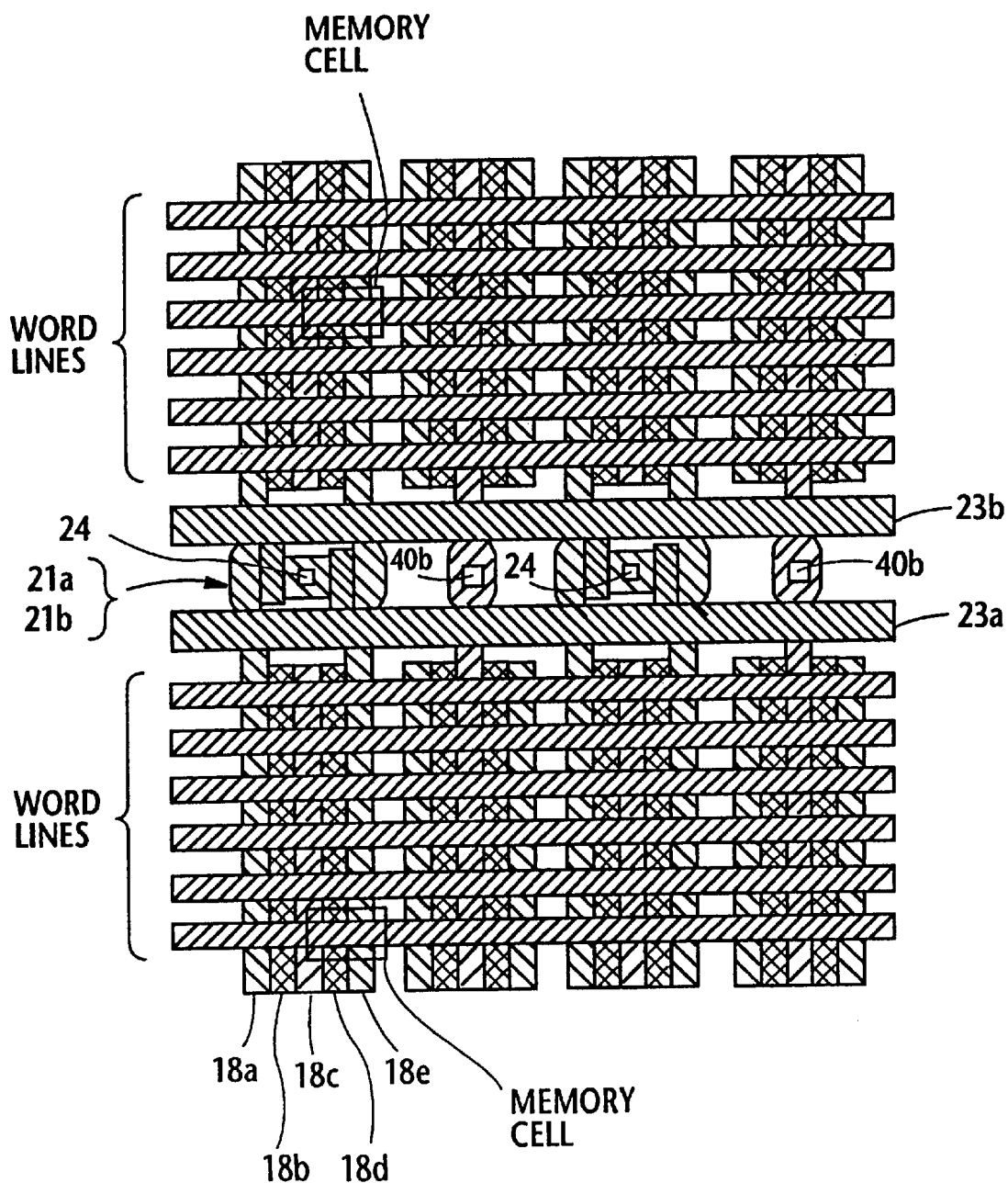
FIG. 7 is a diagram schematically showing layout of part of the arrangement of FIG. 6.

Referring to FIG. 6, a plurality of circuits 11 are shown, each of which has been described in connection with FIG. 5. Noting that each memory cell block 11 is not yet provided with main bit lines and source lines (typically made of metal) for interconnecting the cell blocks. The purpose of presenting FIG. 6 is to show that the two adjacent circuits 11 are positioned such that one is displaced or shifted in the column direction one half thereof relative to the other. On the other hand, FIG. 7 is a diagram schematically showing layout of a plurality of memory cell blocks 11 (FIG. 5) in the vicinity of the bit line contacts 24 and the source line contact 40b. The arrangement shown in FIG. 7 is readily understood when referring to the circuitry of FIG. 6 and thus, further description thereof will be omitted for brevity.

Figure 8:
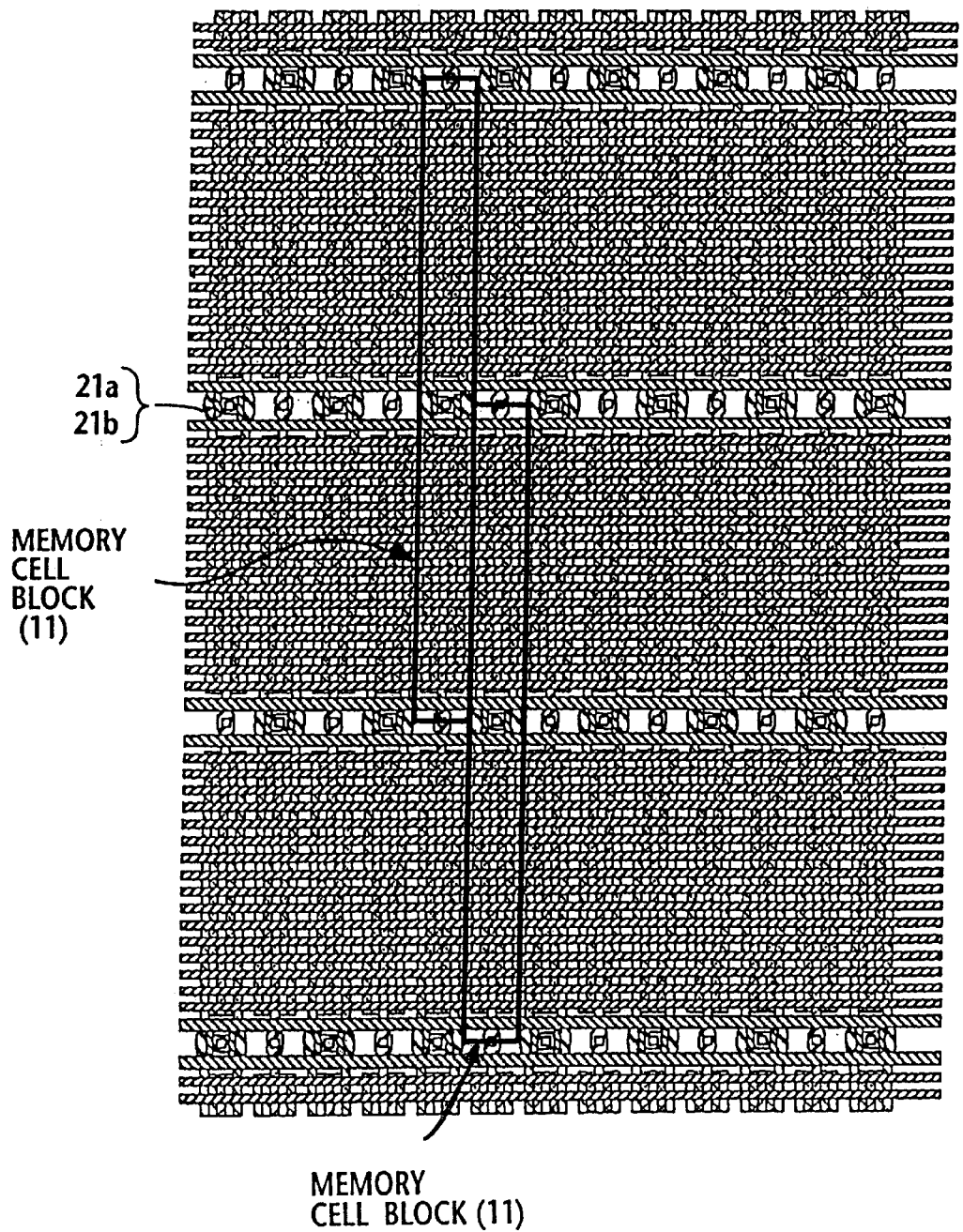
FIG. 8 is a diagram schematically showing layout of the memory cell blocks for a better understanding of the first embodiment of the present invention.

FIG. 8 is a sketch schematically showing a large number of memory cell blocks in order to clearly show that the two adjacent memory cell blocks 11 are positioned such that one is displaced or shifted in the column direction one half thereof relative to the other.

Figure 9:
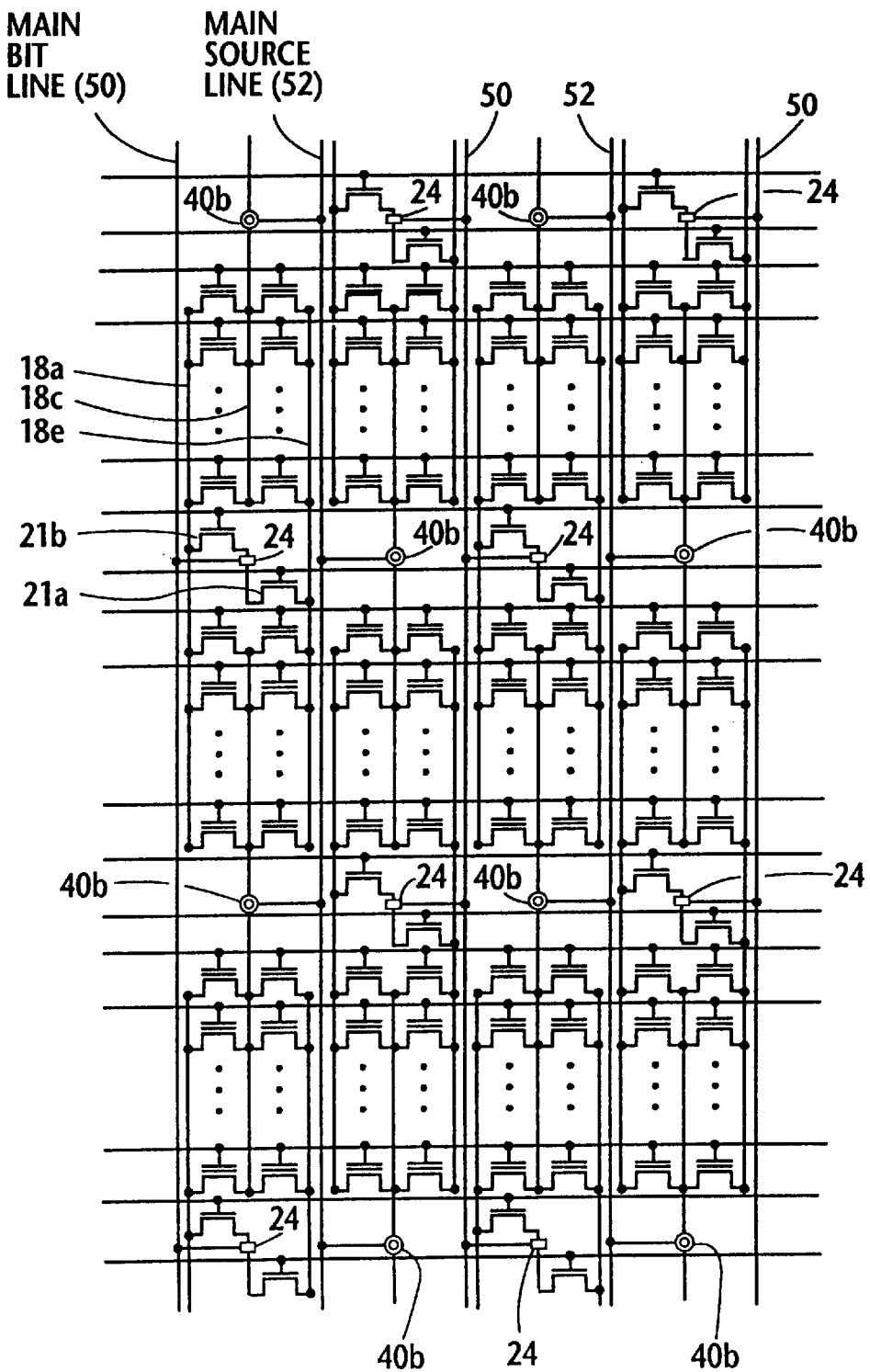
FIG. 9 is a circuit diagram schematically showing main bit lines and main source lines that are added to the circuit of FIG. 6.

FIG. 9 is a circuit diagram showing main bit lines 50 and main source lines 52, which are added to the circuit substantially identical with that of FIG. 6. The layout of the memory cell blocks which are provided with the main bit lines 50 and the source lines 52. Although not shown in FIG. 6, each of the main source lines is coupled to a virtual ground line via a select transistor whose on/off operations are controlled in response to a control signal.

Figure 10:
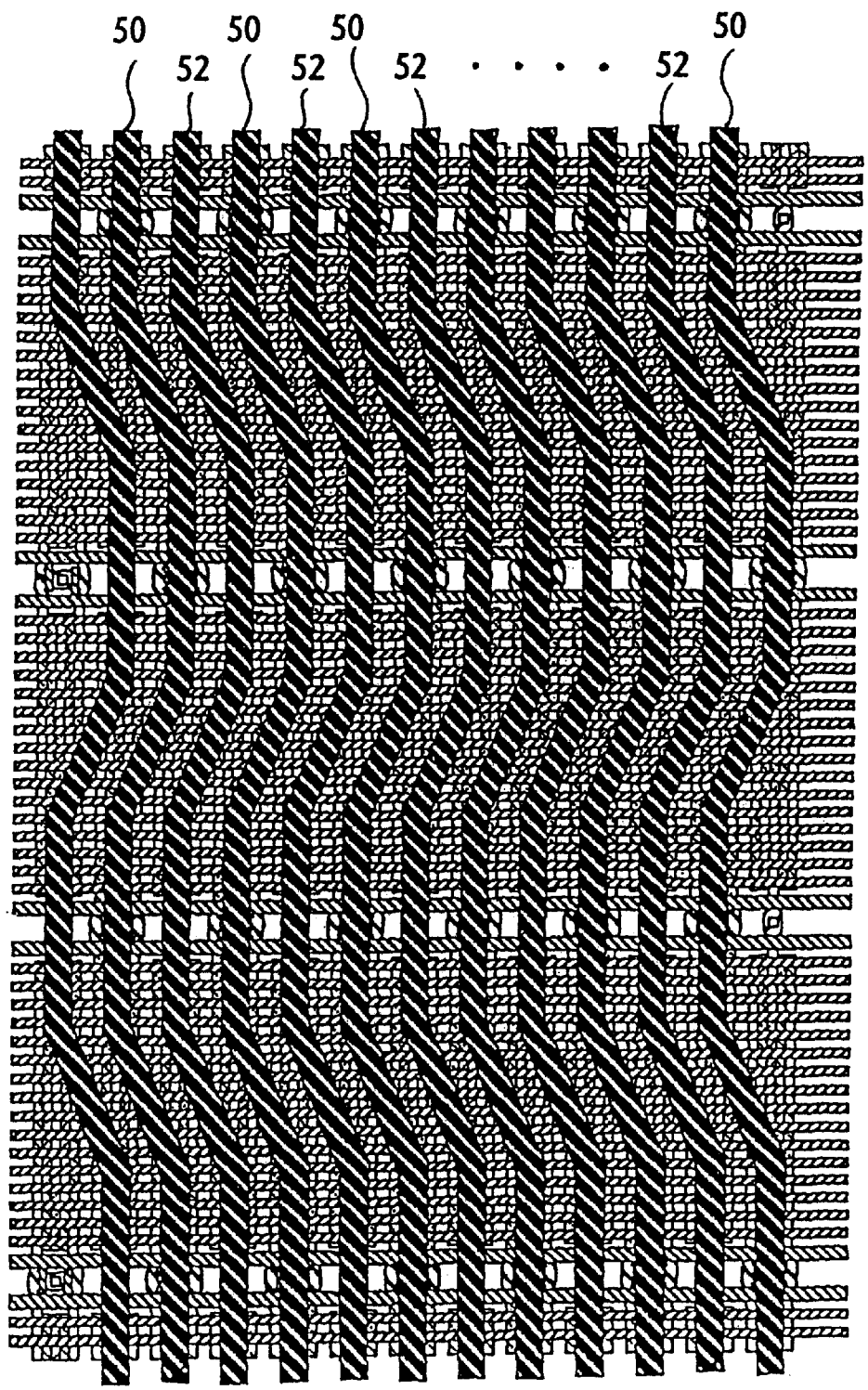
FIG. 10 is a diagram showing layout of the memory cell blocks whose circuit has been shown in FIG. 9.

As shown in FIG. 10, the main bit lines 50 ran zigzag in the column direction connecting the buried local bit lines 18a and 18e in two adjacent columns of memory cell blocks alternately. This permits the number of main bit lines to be half, thereby reducing the pitch of the main bit lines with the result in reducing the memory cell area. In a similar manner, the main source lines 52 ran zigzag in the column direction connecting the buried local source lines 18c in two adjacent columns of memory cell blocks alternately.

Referring to FIGS. 11A–11F, one example of fabricating a memory cell with a drain-source-drain configuration will briefly be described.

Figure 11A:
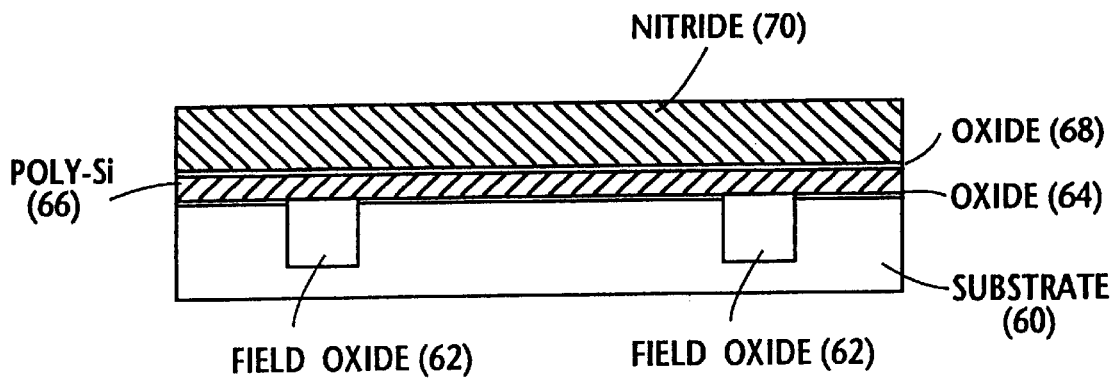
FIGS. 11A to 11F are each a sketch for describing a fabrication step of a memory cell associated with the first embodiment.
Figure 11B:
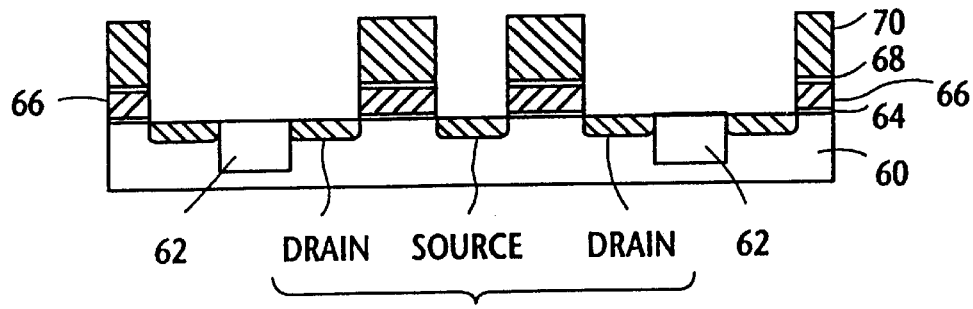
Figure 11C:
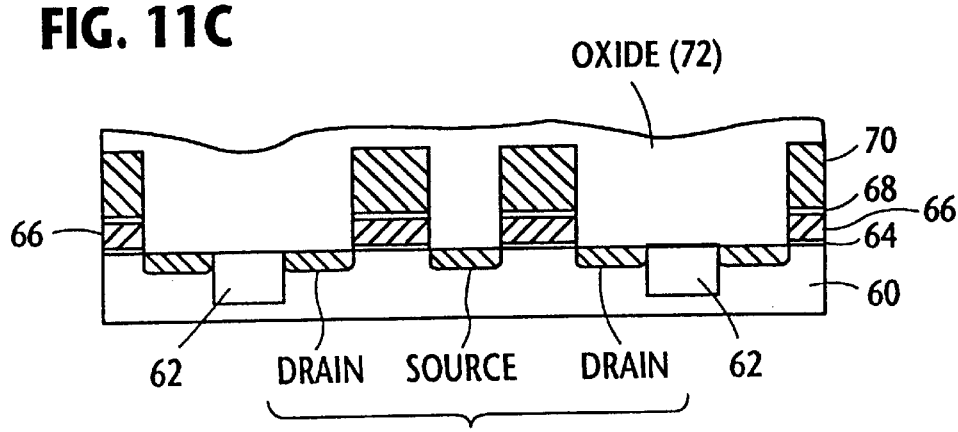
Figure 11D:
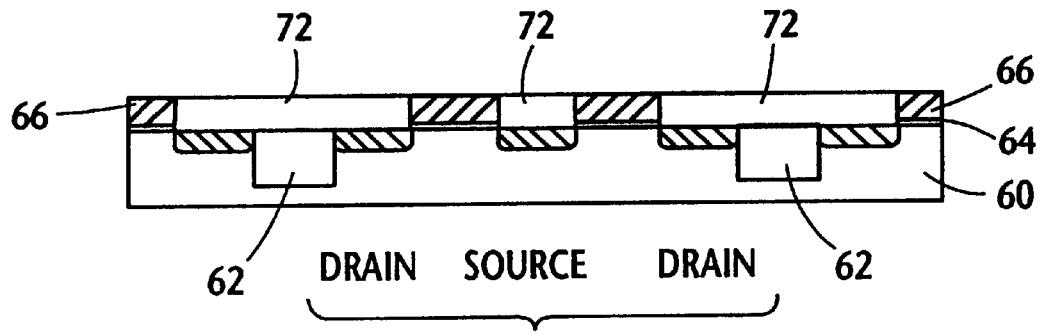
Figure 11E:
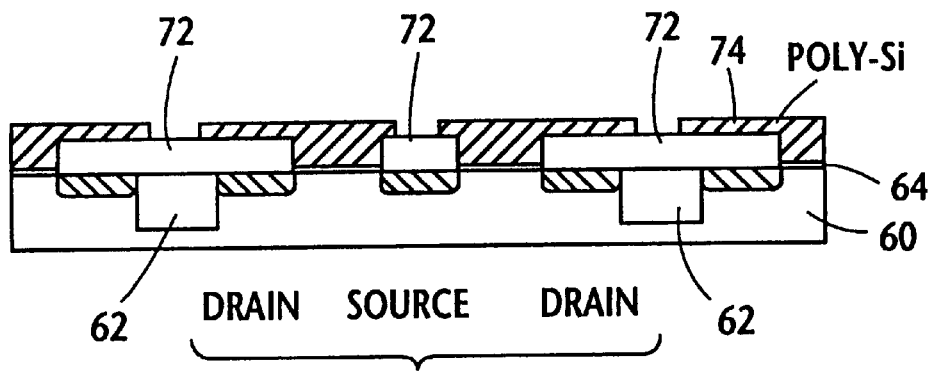
Figure 11F:
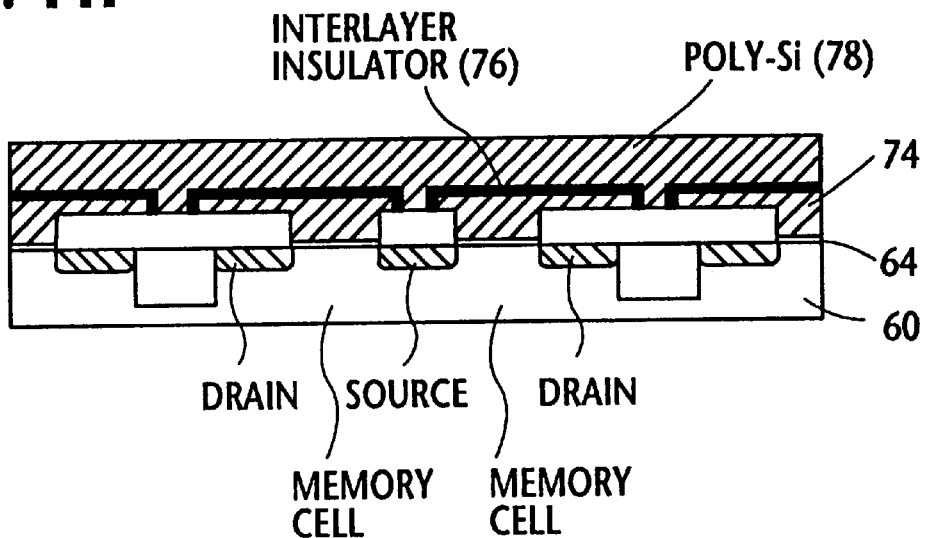

As shown in FIG. 11A, a substrate 60 is prepared on which field oxide regions 62 have already been formed using a known cell segregation technique such as LOCOS (local oxidation of Si). Thereafter, the following films are successively deposited on the substrate 60: an oxide film 64 (80–120 A for example), a poly-Si film 66 (500–1500 A for example), an oxide film (100–200 A for example), and a nitride film 70 (more than 1000 A for example). Following this, the substrate 60 of FIG. 11A is patterned using a resist as a mask, after which ion implantation is implemented to form source and drain regions (FIG. 11B). After removing the resist, the etched regions are refilled with an oxide film 72 (FIG. 11C). Subsequently, the oxide film 72 is flattened, using an etch back process or CMP (chemical mechanical polishing), until the nitride film 70 is exposed. Thereafter, the oxide film 72 is lowered which is located between the nitride film 70 and the poly-Si film 66, after which the nitride film 70 and the oxide film 68 are removed (FIG. 11D). In this case, it is possible to omit the process of etching the oxide film between the CMP process and the nitride film etching. Thereafter, in order to increase a capacitance ratio, a poly-Si film 74 (500–1500 A for example) is formed as shown in FIG. 11E. An interlayer insulator 76 is formed on which a poly-Si film 78 is deposited to form a control gate (FIG. 11F). Thus, a memory cell is fabricated.

Figure 12:
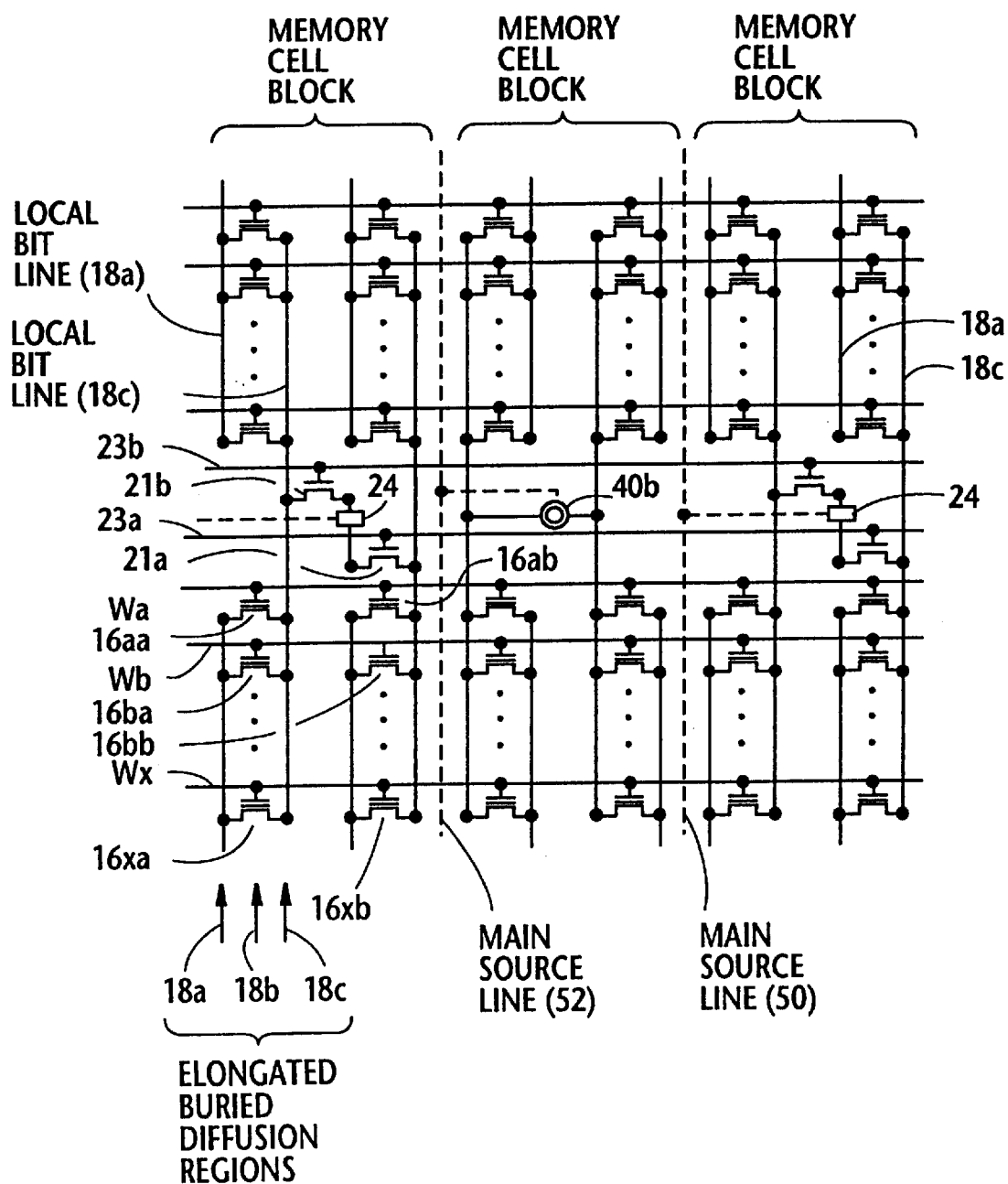
FIG. 12 is a circuit diagram schematically showing a memory cell block according to a second embodiment of the present invention.
Figure 13:
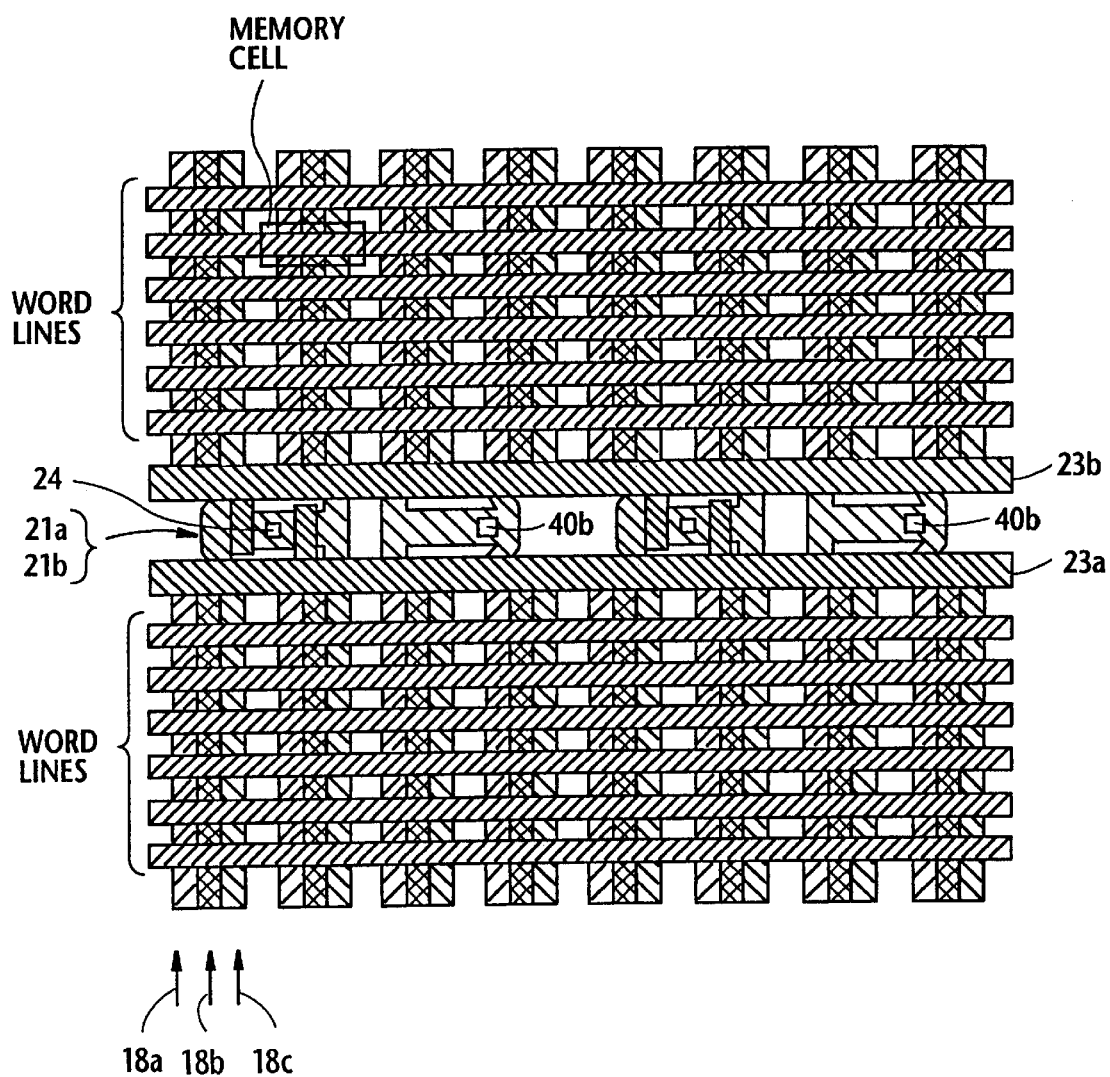
FIG. 13 is a diagram schematically showing layout of the circuit of FIG. 12.
Figure 14:
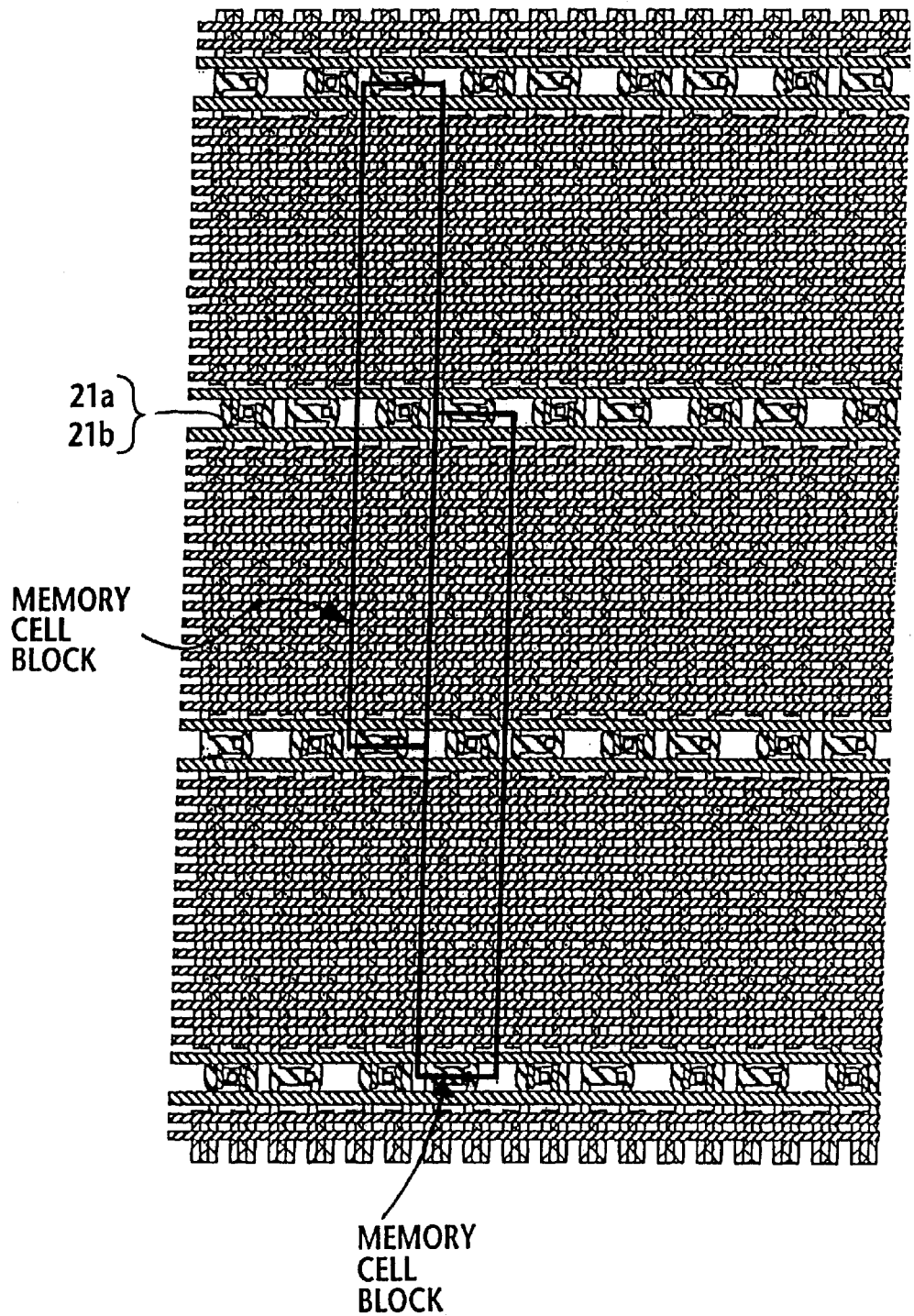
FIG. 14 is a diagram schematically showing layout of the memory cell blocks for a better understanding of the second embodiment.
Figure 15:
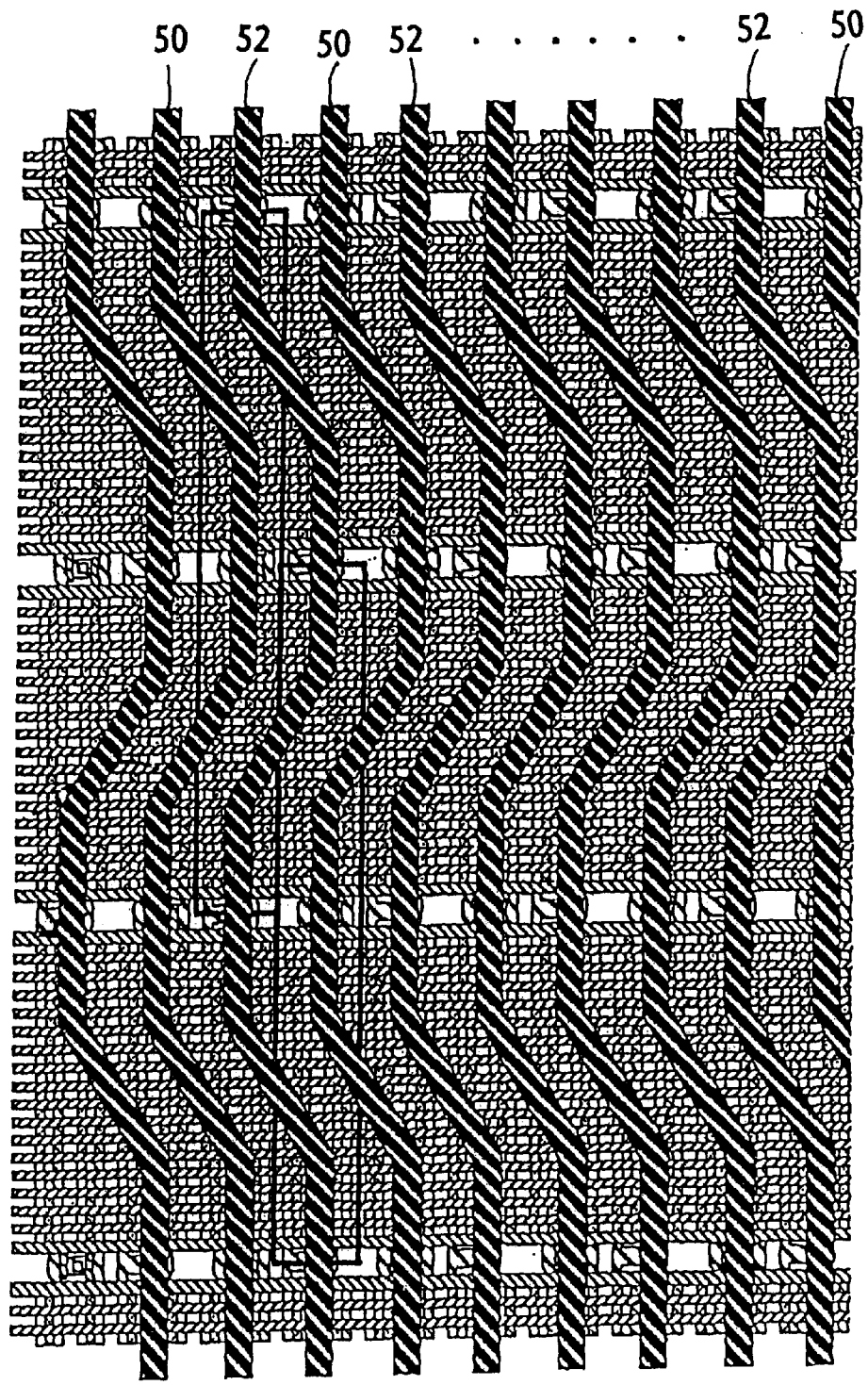
FIG. 15 is a diagram showing layout of the memory cell blocks with the metal lines being formed.

A second embodiment of the present invention will be described with reference to FIGS. 12–15. The second embodiment comprises, as in the first embodiment, a plurality of memory cell blocks each of which includes a plurality of pairs of transistors arranged in the column direction. As shown in FIG. 12, each pair of transistors comprises two single transistors (16aa, 16ab, 16ba, . . . , 16xa, 16xb). In other words, the two transistors, arranged in the row direction (viz., one pair of transistors) of the second embodiment, are not fabricated based on a drain-source-drain configuration as in the first embodiment. Other than this, the second embodiment is substantially identical with the first embodiment except for some portions. One difference between the second and first embodiments is that the diffusion regions 18a and 18c of the second embodiment are respectively a local source line and a local bit source line.

The main bit lines 50 (FIG. 15) ran zigzag in the column direction connecting the two buried local bit lines 18c in two adjacent columns of memory cell blocks alternately. Therefore, a single main bit lines 50 is coupled to four local bit lines 18c, thereby reducing the pitch of the main bit lines with the result in reducing the memory cell area. In a similar manner, the main source lines 52 ran zigzag in the column direction connecting the two buried local source lines 18a in two adjacent columns of memory cell blocks alternately.

FIGS. 12, 13, 14 and 15 of the second embodiment respectively correspond to FIGS. 6, 7, 8 and 11 of the first embodiment. The second embodiment is clearly shown in FIGS. 12–15 and can readily be understood in view of the descriptions of the first embodiment. Accordingly, a further discussion of the second embodiment will be omitted for simplifying the description.

It will be understood that the above disclosure is representative of only one possible embodiment of the present invention and that the concept on which the invention is based is not specifically limited thereto.

What is claimed is:

1. A contactless non-volatile memory, comprising:

a plurality of columns of memory cell blocks, each column of memory cell blocks comprising two columns of memory cells, the memory cells of each column of memory cells being interconnected by way of a buried local bit line and a buried local source line; and a plurality of main bit lines which run zigzag in the column direction so as to connect the buried local bit lines in two adjacent columns of memory cell blocks alternately.

2. A contactless non-volatile memory as claimed in claim 1, further comprising a plurality of main source lines which ran zigzag in the column direction so as to connect the buried local source lines in two adjacent columns of memory cell blocks alternately.

3. A contactless non-volatile memory as claimed in claim 1, wherein said two adjacent columns of memory cell blocks are provided in a manner to be displaced in the column direction one half with other.

4. A contactless non-volatile memory as claimed in claim 1, wherein two memory cell in the two adjacent columns of memory cells are fabricated based on a drain-source-drain configuration thereby sharing a source region and said buried local source line.

5. A contactless non-volatile memory as claimed in claim 1, wherein each of said columns of memory cell blocks comprises two bit line select transistors via which each of said plurality of main bit lines is connectable to one of the two buried local bit lines.

6. A contactless non-volatile memory, comprising:

a plurality of columns of memory cell blocks, each column of memory cell blocks comprising two columns of memory cells, the memory cells of each column of memory cells being interconnected by way of a buried local bit line and a buried local source line;

a plurality of main bit lines which run zigzag in the column direction so as to connect the buried local bit lines in two adjacent columns of memory cell blocks alternately; and a plurality of main source lines which run zigzag in the column direction so as to connect the buried local source lines in two adjacent columns of memory cell blocks alternately.

7. A contactless non-volatile memory as claimed in claim 6, wherein said two adjacent columns of memory cell blocks are provided in a manner to be displaced in the column direction one half with other.

8. A contactless non-volatile memory as claimed in claim 6, wherein two memory cells in the two adjacent columns of memory cells are fabricated based on a drain-source-drain configuration thereby sharing a source region and said buried local source line.

9. A contactless non-volatile memory as claimed in claim 6, wherein each of said columns of memory cell blocks comprises two bit line select transistors via which each of said plurality of main bit lines is connectable to one of the two buried local bit lines.

* * * * *

UNITED STATES PATENT AND TRADEMARK OFFICE
CERTIFICATE OF CORRECTION

PATENT NO. : 6,064,592
DATED : May 16, 2000
INVENTOR(S) : Kenichiro Nakagawa, et al.

It is certified that error appears in the above-identified patent and that said Letters Patent are hereby corrected as shown below:

Column 6, Line 23, Claim 4: "cell" should read --cells--

Signed and Sealed this

Seventeenth Day of April, 2001

Attest:

NICHOLAS P. GODICI

*Attesting Officer*   *Acting Director of the United States Patent and Trademark Office*